(12) United States Patent
Okamoto et al.

(10) Patent No.: US 6,838,546 B2
(45) Date of Patent: Jan. 4, 2005

(54) AROMATIC LIQUID-CRYSTALLINE POLYESTER SOLUTION COMPOSITION

(75) Inventors: Satoshi Okamoto, Tsukuba (JP); Manabu Hirakawa, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 264 days.

(21) Appl. No.: 09/915,475

(22) Filed: Jul. 27, 2001

(65) Prior Publication Data

US 2002/0049270 A1 Apr. 25, 2002

(30) Foreign Application Priority Data

| Jul. 31, 2000 | (JP) | 2000-230782 |
| Aug. 11, 2000 | (JP) | 2000-244276 |
| Mar. 27, 2001 | (JP) | 2001-089622 |
| Apr. 27, 2001 | (JP) | 2001-132009 |

(51) Int. Cl.$^7$ .............. C08J 3/11; C08G 63/19; C08K 3/10; C08K 3/22; C08K 3/36

(52) U.S. Cl. ............ 528/495; 528/305; 528/308; 528/491; 524/431; 524/456; 524/493

(58) Field of Search ............... 528/495, 491, 528/305, 308; 524/456, 493, 431

(56) References Cited

U.S. PATENT DOCUMENTS

| 4,375,530 A | 3/1983 | Hay et al. |
| 4,386,007 A | 5/1983 | Krause et al. |
| 4,529,565 A | 7/1985 | Kasatani et al. |
| 5,006,631 A | 4/1991 | Kawabe et al. |
| 5,408,347 A * | 4/1995 | Murakami et al. ........ 349/132 |
| 5,508,069 A * | 4/1996 | Jin ....................... 428/1.2 |
| 5,943,110 A * | 8/1999 | Yoda et al. ............. 349/134 |
| 5,962,122 A | 10/1999 | Walpita et al. |

FOREIGN PATENT DOCUMENTS

| EP | 0672721 A2 | 9/1995 |
| EP | 0964014 A2 | 12/1999 |
| JP | 62-64832 | 3/1987 |
| JP | 5-186614 | 7/1993 |
| JP | 8-217894 | 8/1996 |
| JP | 8-281817 | 10/1996 |

OTHER PUBLICATIONS

Ross, S., Colloidal Systems and Interfaces, pp. 78–81, (1988).

* cited by examiner

*Primary Examiner*—Tae H. Yoon
(74) *Attorney, Agent, or Firm*—Birch, Stewart, Kolasch & Birch, LLP

(57) ABSTRACT

The invention relates to an aromatic liquid-crystalline polyester solution composition comprising 100 parts by weight of a solvent (A) and 0.01 to 100 parts by weight of an aromatic liquid-crystalline polyester (B), wherein the solvent (A) is a solvent containing 30% by weight or more of a chlorine-substituted phenol compound represented by the following general formula (I):

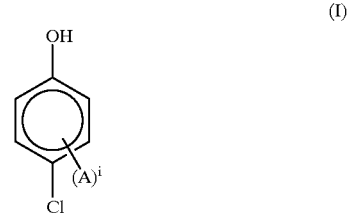

wherein A represents a hydrogen atom, a halogen atom or a tri-halogenated methyl group, and i represents an integer of 1 or more and 4 or less, a film obtained from the aromatic liquid-crystalline polyester, and a process for producing the film.

8 Claims, 1 Drawing Sheet

AROMATIC LIQUID-CRYSTALLINE POLYESTER SOLUTION COMPOSITION

BACKGROUND OF THE INVENTION

1. Field of the Invention

The present invention relates to an aromatic liquid-crystalline polyester solution composition, a less anisotropic film obtained by casting said composition and a process for producing said film.

2. Description of Related Art

Since aromatic liquid-crystalline polyesters show an excellent high-frequency performance and a low hygroscopicity, they are expected to be substrate materials for electronics. Conventionally known aromatic liquid-crystalline polyester films obtained by extrusion molding, however, have a problem that they have weak mechanical properties in the transverse direction (TD) as compared to the machine direction (MD) (flow direction), i.e., have a large anisotropy, because the liquid-crystalline polyesters have a property that they are remarkably oriented in the extruding direction.

As methods for obtaining an aromatic liquid-crystalline polyester film, for example, methods have been known in which a solution composition is prepared by dissolving an aromatic liquid-crystalline polyester in trifluoroacetic acid (JP-A 62-64832), or tetrafluorophenol (JP-AB-281817), said solution composition is cast, and the solvent is evaporated from the cast product to give an aromatic liquid-crystalline polyester film. However, these solvents have problems that they have a strong corrosive property and the like and are not necessarily easy to handle.

The purpose of the invention is to provide an aromatic liquid-crystalline polyester solution composition using a solvent that is easy to handle, a less anisotropic film obtained by casting said composition and a process for producing said film.

As the result of extensive studies for an aromatic liquid-crystalline polyester solution composition having no such problems, the present inventors have found that a less anisotropic aromatic liquid-crystalline polyester film can be produced, from an aromatic liquid-crystalline polyester solution composition in which a specific amount of an aromatic liquid-crystalline polyester is dissolved in a solvent containing a specific chlorine-substituted phenol compound, by casting said solution composition and then removing the solvent.

SUMMARY OF THE INVENTION

The invention relates to the following [1] to [3]:

[1] An aromatic liquid-crystalline polyester solution composition comprising 100 parts by weight of a solvent (A) and 0.01 to 100 parts by weight of an aromatic liquid-crystalline polyester (B), wherein said solvent (A) is a solvent containing 30% by weight or more of a chlorine-substituted phenol compound represented by the following general formula (I):

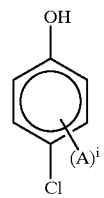

wherein A represents a hydrogen atom, a halogen atom or a tri-halogenated methyl group, and i represents an integer of 1 or more and 4 or less.

[2] An aromatic liquid-crystalline polyester film obtained by casting an aromatic liquid-crystalline polyester solution composition according to [1] and removing the solvent.

[3] A process for producing an aromatic liquid-crystalline polyester film which comprises the steps of casting the aromatic liquid-crystalline polyester solution composition according to [1], and removing the solvent.

As referred to in the specification, the "film" includes very thin films in the form of sheets and thick films, not only in the form of sheets but also in the form of containers such as a bottle.

DETAILED DESCRIPTION OF THE INVENTION

Figure 1:
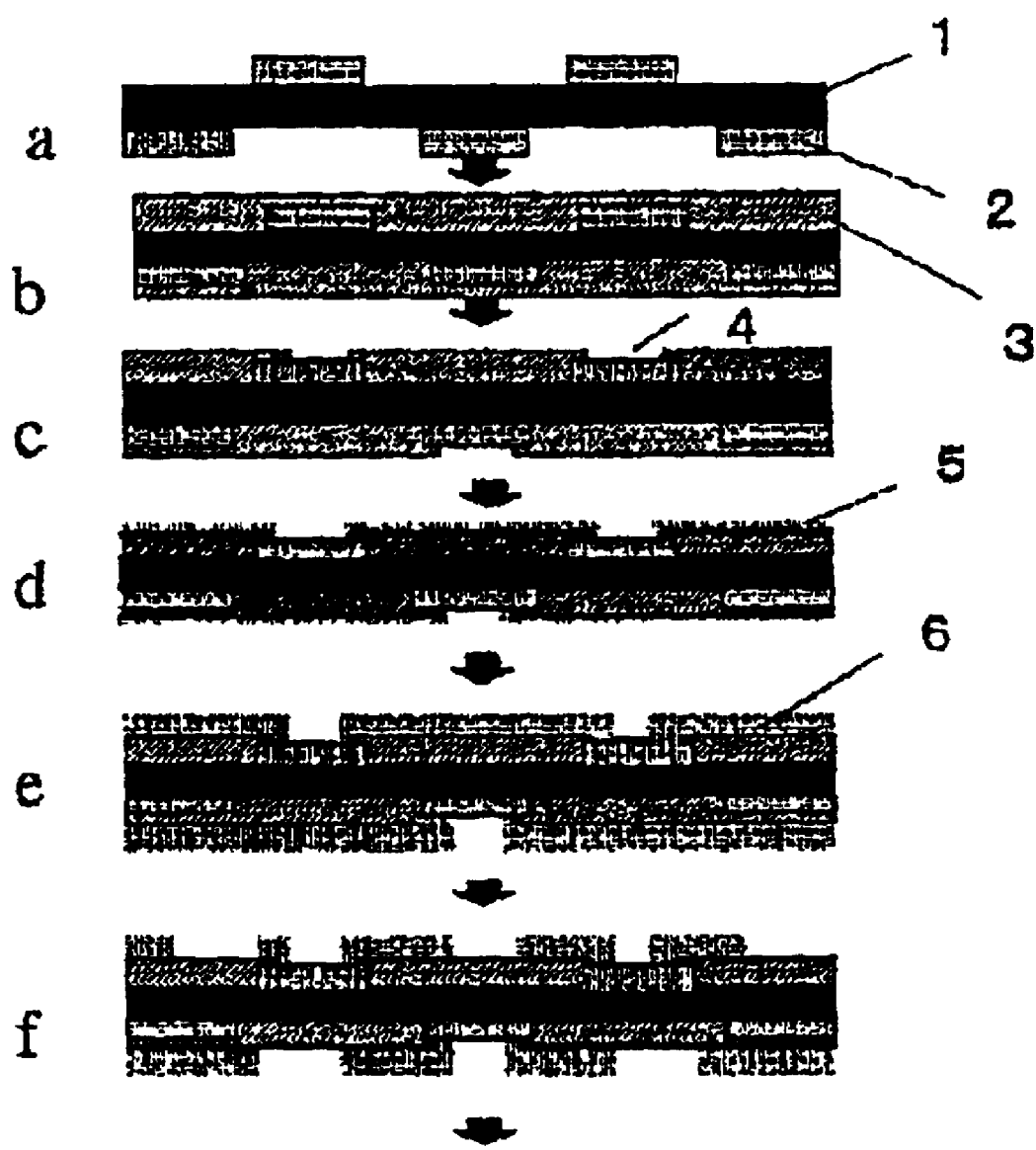
FIG. 1 is a view for illustrating an example of a process for producing a multilayer print circuit board; and In the drawings, 1 is a substrate, 2 and 7 are circuit patterns, 3 is a insulating resin layer, 4 is a via-hole, 5 is an electroless plating deposit, and 6 is an electroplating deposit.

The aromatic liquid-crystalline polyester used in the invention is a polyester called thermotropic liquid crystalline polymer, and includes, for example, (1) a polymer comprising a combination of an aromatic dicarboxylic acid, an aromatic diol and an aromatic hydroxycarboxylic acid,
(2) a polymer comprising different aromatic hydroxycarboxylic acids,
(3) a polymer comprising a combination of an aromatic dicarboxylic acid and an aromatic diol,
(4) a polymer produced by reacting a polyester such as polyethylene terephthalate with an aromatic hydroxycarboxylic acid, and the like, which form isotropic melt at a temperature of 400° C. or below. As raw materials for synthesis, ester-forming derivatives can be used in place of the aromatic dicarboxylic acid, aromatic diol and aromatic hydroxycarboxylic acid.

Examples of the ester-forming derivatives of carboxylic acid include compounds in which the carboxylic group is converted to a derivative having a high reactivity and promoting a reaction for producing a polyester such as acid chloride, acid anhydride and the like; and compounds in which the carboxylic group forms an ester with an alcohol, ethylene glycol or the like thus being converted to a derivative that forms a polyester by the ester-exchange reaction.

Examples of the ester-forming derivative of phenolic hydroxyl group include compounds in which the phenolic hydroxyl group forms an ester with a carboxylic acid thus being converted to a derivative that forms a polyester by the ester-exchange reaction.

The aromatic dicarboxylic acid, aromatic diol and aromatic hydroxycarboxylic acid may be substituted with a halogen atom, an alkyl group, an aryl group or the like insofar as the substitution does not inhibit the ester-forming ability.

Examples of the repeating unit in the aromatic liquid-crystalline polyester include the following units but not limited to:

Repeating units derived from aromatic hydroxycarboxylic acids:

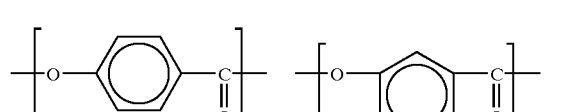

Repeating units derived from aromatic dicarboxylic acids:

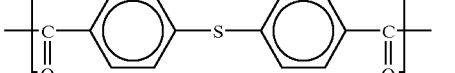

-continued

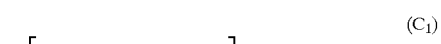

Repeating units derived from aromatic diols:

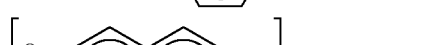

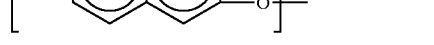

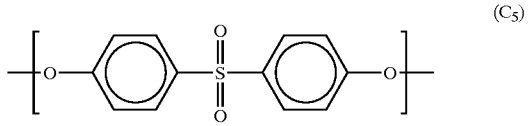
(C₅)

The above structural units derived from aromatic hydroxycarboxylic acids, structural units derived from aromatic dicarboxylic acids and structural units derived from aromatic diols may have a substituent such as a halogen atom, an alkyl group, an aryl group or the like on the aromatic ring.

Preferred alkyl groups are alkyl groups having 1 to 10 carbon atoms and preferred aryl groups are aryl groups having 6 to 20 carbon atoms.

It is preferred that the aromatic liquid-crystalline polyester contain at least 30% by mole of the repeating unit represented by the formula $A_1$ described above from the viewpoint of a balance between thermal resistance and mechanical properties.

Specifically, preferred combination of the repeating units are combinations shown in the following formulae (a) to (f):

(a): $(A_1)$, $(B_2)$, and $(C_3)$, or $(A_1)$, a mixture of $(B_1)$ and $(B_2)$, and $(C_3)$;

(b): a combination in which a part or all of $(C_3)$ in the combination of the structural units under (a) is replaced by $(C_1)$;

(c): a combination in which a part or all of $(C_3)$ in the combination of the structural units under (a) is replaced by $(C_2)$;

(d): a combination in which a part or all of $(C_3)$ in the combination of the structural units under (a) is replaced by $(C_4)$;

(e): a combination in which a part or all of $(C_3)$ in the combination of the structural units under (a) is replaced by a mixture of $(C_4)$ and $(C_5)$;

(f): a combination in which a part or all of $(A_1)$ in the combination of the structural units under (a) is replaced by $(A_2)$.

In addition, it is preferred, form the viewpoint of generation of liquid crystalline phase, that the aromatic liquid-crystalline polyester used in the invention comprises 30 to 80% by mole of a repeating unit $(A_1)$ derived from p-hydroxybenzoic acid, 10 to 35% by mole of a repeating unit $((C_1), (C_2), (C_3), (C_4)$ and $(C_5))$ derived from at least a compound selected from the group consisting of hydroquinone, resorcinol, 4,4'-dihydroxybiphenyl, bisphenol A and bisphenol S, and 10 to 35% by mole of a repeating unit $((B_1), (B_2)$ and $(B_3))$ derived from at least a compound selected from the group consisting of terephthalic acid, isophthalic acid and naphthalenedicarboxylic acid.

Among them, the content of a repeating unit derived from isophthalic acid is preferably 0.5 mole or above, and more preferably 0.8 mole or above, when the totalized molar number of repeating units derived from at least one compound selected from the group consisting of terephthalic acid, isophthalic acid and naphthalenedicarboxylic acid is taken as 1, from the viewpoint of improvement in solubility.

Processes for producing the aromatic liquid-crystalline polyester used in the invention may be adopted form the conventional processes and include processes described in JP-B-Sho47-47870, JP-B-Sho63-3888 and others.

The solvent used in the aromatic liquid-crystalline polyester solution composition of the invention is a solvent containing 30% by weight or more, preferably 50% by weight or more, more preferably 60% by weight or more and most preferably 70% by weight or more, of a chlorine-substituted phenol compound represented by the above-described formula (I).

By using the above solvent, the aromatic liquid-crystalline polyester can be dissolved at the ordinary temperature or under heating. Since the aromatic liquid-crystalline polyester can be dissolved at a relatively low temperature, it is particularly preferred, because of needlessness of mixing other solvent and therefore of easiness, that substantially 100% by weight of said chlorine-substituted phenol compound is used.

In the formula, A represents a hydrogen atom, a halogen atom or a tri-halogenated methyl group, and i represents an integer of 1 or more and 4 or less. When i is 2 or more, plural A may be the same or different, and preferably they are the same.

Halogen atom includes fluorine atom, chlorine atom, bromine atom and iodine atom. Fluorine atom and chlorine atom are preferred from the viewpoint of solubility and chlorine atom is more preferred from the viewpoint of a balance between costs and solubility.

Examples of compounds wherein halogen atom is chlorine atom include 2,4-dichlorophenol, 3,4-dichlorophenol, 2,4,5-trichlorophenol, 2,4,6-trichlorophenol, pentachlorophenol and the like.

Examples of compounds wherein halogen atom is fluorine atom include 4-chloro-2-fluorophenol, 4-chloro-3-fluorophenol and the like.

Examples of compounds wherein halogen atom is bromine atom include 4-chloro-2-bromophenol and the like, and examples of compounds wherein halogen atom is iodine atom include 4-chloro-2-iodophenol and the like.

Halogen in the tri-halogenated methyl group includes the same atom as described above. Trifluoromethyl group is preferred from the viewpoint of availability. Examples of groups substituted with trifluoromethyl group include 4-chloro-2-trifluoromethylphenol, 4-chloro-2-pentafluoroethylphenol and the like.

In addition, among these compounds, compounds wherein all the substituents in the formula (I) are chlorine atoms, i.e., compounds wherein, in the formula (I), i is 1 or more and A is all chlorine atom, and a compound wherein, in the formula (I), i is 0, are preferred from the viewpoint of costs and availability.

Specific examples include 4-chlorophenol, 2,4-dichlorophenol, 3,4-dichlorophenol, 2,4,5-trichlorophenol, 2,4,6-trichlorophenol and pentachlorophenol, with 4-chlorophenol being particularly preferred.

Components contained in the solvent in addition to the chlorine-substituted phenol compound are not particularly limited insofar as they cause deposition of the aromatic liquid-crystalline polyester during storage of the solution or during casting as described later, and preferred components include chlorine compounds such as o-dichlorobenzene, chloroform, methylene chloride, tetrachloroethane and the like, because they do not affect the solubility.

The amount of the aromatic liquid-crystalline polyester is 0.01 to 100 parts by weight based on 100 parts by weight of the solvent. When the amount is less than 0.01 part by weight, a uniform applying cannot be performed due to a too low viscosity of the solution. The amount is preferably within a range of 1 to 50 parts by weight, more preferably within a range of 2 to 10 parts by weight, from the viewpoint of applicability and economy.

The aromatic liquid-crystalline polyester solution composition of the invention may be prepared in the form of an insulating solution composition by adding an inorganic filler. The inorganic filler used in the insulating solution composition may be a conventional filler and examples include inorganic fillers such as silica, alumina, titanium oxide, calcium carbonate, talc, mica and the like. Among them, silica is preferred.

Silica includes various synthetic silica produced by wet method or dry method, crushed silica produced by crushing quartzite, fused silica, i.e., once fused silica or the like and other various products.

The amount of the inorganic filler is preferably selected so that the content of the inorganic filler is 5% by weight to 70% by weight based on the total solid content of resin. When the amount of the inorganic filler exceeds 70% by weight, a insulating resin obtainable from the insulating solution composition has a tendency to fragileness, because a toughness of the aromatic liquid-crystalline polyester is not conferred, and when it is less than 5% by weight, the insulating resin has a tendency to have a lower improvement effect in linear expansion coefficient.

It is preferred that the inorganic filler has an average particle diameter of 0.1 μm or above and 10 μm or lower. When the average particle diameter is less than 0.1 μm, the inorganic filler easily aggregates, and becomes hard to handle because of an increased viscosity of the solution composition (varnish), which brings about a lower workability. When the particle diameter exceeds 10 μm, roughened surface becomes too rough when a surface-roughening step is conducted, and there is a tendency that circuit pattern is not suitable to fine patterning.

The insulating solution composition has an excellent performance that, when it is used, for example, in the production of a multilayer print circuit board, an insulating layer obtainable from said composition has a low linear expansion coefficient, the tightness of bonding between an insulating layer obtainable from said composition and electroplating deposit is improved and so on.

The insulating solution composition may contain, if necessary, additives such as coupling agent, leveling agent, antifoam, ultraviolet absorber, flame retarder and the like, and pigments for coloring.

In addition, the insulating solution composition may contain, within a range for avoiding adverse effect on the purpose of the invention, for example, at least one of thermoplastic resins such as polyamides, polyesters, polyphenylene sulfides, polyether ketones, polycarbonates, polyether sulfones, polyphenyl ethers and modification products thereof, polyether imides and the like, or of thermosetting resins such as phenol resins, epoxy resins, polyimide resins, cyanate resins and the like.

The insulating solution composition of the invention can be produced by filtering, if necessary, a solution in which an aromatic liquid-crystalline polyester is dissolved through a filter or the like so that fine foreign substances contained in the solution are removed, and then adding an inorganic filler.

In addition, an inorganic filler or membrane can be produced by casting said insulating solution composition on a support having a flat and uniform surface comprising Teflon (R), metal, glass or the like, then removing the solvent and peeling from the supporting substrate. The obtained film or membrane may be heat-treated, if necessary.

Methods for removing the solvent are not particularly limited and preferred method is evaporation of the solvent including evaporation with, for example, heating, vacuum, ventilation and the like. Among them, evaporation with heating is preferred from the viewpoint of productivity and handling, and evaporation with heating and ventilation is more preferred.

Next, a so-called built-up method is described as an example of preferred methods for producing a multilayer print circuit board using the insulating solution composition of the invention.

At the start, a substrate having a first circuit pattern is prepared.

Examples of said substrate include plastic substrate, ceramic substrate, metal substrate, film substrate and the like, and specifically, glass epoxy substrate, bismaleimide-triazine substrate, aramid fiber non-woven fabric substrate, liquid-crystalline polymer substrate, aluminum substrate, iron substrate, polyimide substrate and the like.

Next, the insulating solution composition of the invention is applied onto the substrate having the first circuit pattern, and then the solvent is removed to form an insulating layer.

The insulating solution composition of the invention is applied on the substrate having the first circuit pattern by any of various means including, for example, roller coating method, dip coating method, spray coating method, spinner coating method, curtain coating method, slot coating method, screen printing method and the like, after removing, if necessary, fine foreign substances contained in the solution by filtering through a filter or the like.

Methods for removing the solvent are not particularly limited and preferred method is evaporation of the solvent including evaporation with, for example, heating, vacuum, ventilation and the like. Among them, evaporation with heating is preferred from the viewpoint of productivity and handling, and evaporation with heating and ventilation is more preferred.

The heating is preferably carried out by pre-drying at 70 to 100° C. for 30 minutes to 2 hours, and then heat-treating at 180 to 250° C. for 30 minutes to 4 hours.

Alternatively, an insulating layer can be produced by preparing a film or membrane from the insulating solution composition of the invention by a method described above and pasting said film or membrane onto a substrate. Methods for pasting the film are not particularly limited and preferred methods include pressure-contact bonding with heating, vacuum laminating and the like from the viewpoint of productivity and tight adhesion.

The insulating layer obtained in this manner has usually a thickness of about 20 to 100 μm and may have a thickness of more than 100 μm when a particularly high insulation is required.

The surface of said insulating layer may be subjected to abrasion, or subjected to a treatment with a solution of a chemical such as an acid, an oxidizing agent or the like, or with a irradiation of ultraviolet rays or plasma, if necessary.

In order to obtain electric communication with the first circuit pattern, a via-hole can be formed in the insulating layer by, for example, a laser or the like. It is preferred that the via-hole is formed before deposition of a metal layer by electroless plating as described below.

The laser to be used includes $CO_2$ laser, UV/YAG laser, excimer laser and the like. Use of the laser is preferred because its use enables a via-hole having a size smaller than that of a via-hole formed by so-called photolithography.

Thereafter, a metal layer for making a second circuit pattern by applying electroless plating and electroplating. Examples of electroless plating include electroless copper-plating, electroless nickel-plating, electroless gold-plating, electroless silver-plating, electroless tin-plating and the like. In addition, another electroless plating, electroplating or solder coating may be applied after giving an electroless plating.

By applying electroplating using the obtained electroless-plated metal layer as an electrode, an electroplated metal layer can be formed on the electroless-plated metal layer.

Examples of electroplating include copper-electroplating, nickel-electroplating, gold-electroplating, silver-electroplating, tin-electroplating and the like.

The second circuit pattern can be formed by patterning the obtained electroplated metal layer.

Alternatively, the second circuit pattern can also be obtained by performing electroplating after patterning the electroplated metal layer (semi-additive method).

By applying repeatedly the above-described step on the second circuit pattern obtained in such manner, a circuit can be laminated. Using this build-up method, a fine multilayer circuit board can be easily formed.

In addition, the aromatic liquid-crystalline polyester solution composition of the invention may be mixed with a dielectric powder to form a dielectric paste.

The dielectric powder to be used is not particularly limited and examples include powdery materials having a relative dielectric constant of 5 or more including titanates such as barium titanate, strontium titanate, a solid solution of barium titanate and strontium titanate, lead titanate; tantalum nitride, tantalum oxide, tantalum nitride oxide, and further alumina, aluminum nitride, silicon carbide and the like. Among them, preferred are barium titanate, strontium titanate, a solid solution of barium titanate and strontium titanate and tantalum oxide. These can be used independently or in combination of two or more.

The amount of the dielectric powder is 0.2 to 200 parts by weight based on 100 parts by weight of sum of the aromatic liquid-crystalline polyester and the solvent. When the amount is less than 0.2 part by weight, the effect obtainable by addition of the dielectric powder is low and when it exceeds 200 parts by weight, the effect of the aromatic liquid-crystalline polyester as a binder in the dielectric material membrane decreases and sometimes the strength of the membrane is lowed. Preferred amount of the dielectric material is 5 to 50 parts by weight. Preferred particle diameter of the dielectric powder is 0.1 to 10 $\mu$m.

Additionally, the dielectric paste may contain, within a range for avoiding adverse effect on the purpose of the invention, one, two or more of various additives including inorganic fillers such as silica, aluminum hydroxide, calcium carbonate and the like; organic fillers such as cured epoxy resin, cross-linked benzoguanamine resin, cross-linked acryl polymer and the like; thermoplastic resin, for example, polyamide, polyester, polyphenylene sulfide, polyetherketone, polycarbonate, polyether sulfone, polyphenyl ether and modification products therof, polyether imide and the like; thermosetting resin, for example, phenol resin, epoxy resin, polyimide resin, cyanate resin and the like; silane coupling agent, antioxidant, ultraviolet absorber and others.

The dielectric paste according to the invention has a low viscosity and can be easily applied even if the dielectric powder has a high ratio of solid content, for example, 20% by weight or more based on the total paste.

A dielectric material membrane can be obtained by applying the above described dielectric paste on a substrate.

Specifically, a dielectric material membrane comprising an aromatic liquid-crystalline polyester and a dielectric powder can be produced by filtering, if necessary, a dielectric paste through a filter or the like so that fine foreign substances contained in said paste are removed, applying onto a substrate and removing the solvent.

Alternatively, a dielectric material membrane can also be obtained by applying the dielectric paste onto a support having a flat and uniform surface comprising Teflon, metal, glass or the like, then removing the solvent and peeling from said support.

For the viscosity of the dielectric paste, suitable viscosity varies depending on a method for applying and preferred range is 0.1 poise to 100 poise, with more preferred value being 0.5 poise to 30 poise. Methods for applying the dielectric paste are not particularly limited and include conventional methods such as spin coat method, bar coat method, spray coat method and the like.

Methods for removing the solvent are not particularly limited and preferred method is evaporation of the solvent. The method for evaporating the solvent includes heating, vacuum, ventilation and the like. Among them, evaporation with heating is preferred from the viewpoint of productivity and handling, and evaporation with heating and ventilation is more preferred. The obtained dielectric material membrane may be subjected to heat-treatment, if necessary.

The thickness of the dielectric material membrane varies depending on the use and preferred range is 0.5 $\mu$m to 500 $\mu$m, with more preferred value being 1 $\mu$m to 100 $\mu$m.

The substrate is not particularly limited and specific examples include a substrate in which an epoxy resin is impregnated in a glass fiber for print substrate, BT substrate (manufactured by Mitsubishi Gas Chemical Co., Inc.) and the like.

Additionally, the aromatic liquid-crystalline polyester film produced using the aromatic liquid-crystalline polyester solution composition of the invention can be used as a flexible print circuit board and a film for TAB (tape automated bonding) tape, making use of its excellent properties such as high-frequency performance, low hygroscopicity, dimensional stability and so on. Furthermore, it can be used as a film for condenser, a film for speaker diaphragm, an orientation film for liquid-crystal cell and the like, making use of its thin-walled molding property.

EXAMPLES

The invention will now be described specifically with reference to Examples:

Synthesis Example 1

Into a reaction vessel equipped with a stirrer, a torque meter, a nitrogen gas introducer, a thermometer and a reflux condenser were charged 141 g (1.02 mole) of p-hydroxybenzoic acid, 63.3 g (0.34 mole) of 4,4'-dihydroxybiphenyl, 56.5 g (0.34 mole) of isophthalic acid and 191 g (1.87 mole) of acetic anhydride. After sufficiently replacing the inside space of the reaction vessel with nitrogen gas, the mixture was heated up to 150° C. over 15 minutes under a stream of nitrogen gas, and refluxed for 3 hours keeping the temperature.

Then, the mixture was heated up to 320° C. over 170 minutes while distilling out vaporized acetic acid as a by-product and unreacted acetic anhydride. When an increase in torque was observed, the reaction was considered to be completed and the content of the vessel was discharged. The obtained solid substance was cooled to room temperature, crushed with a granulator, kept at 250° C. for 3 hours in a nitrogen atmosphere and subjected to polymerization reaction in the solid phase.

Test samples in the form of disks having a thickness of 3 mm were obtained by compressing 0.4 g of the obtained powdery aromatic liquid-crystalline polyester at 250° C. for 10 minutes under a load of 100 kg using a flow tester CFT-500 (manufactured by Shimadzu Corp.). The test samples were tested with HP4291A RF impedance/material analyzer manufactured by Hewlett Packard and it was observed that the powdery aromatic liquid-crystalline polyester used had a dielectric constant of 2.99 and a dielectric loss tangent of 0.012 at a high frequency (1 GHz). In addition, they were tested for water absorption at 85° C./85% RH for 168 hours using a thermo-hygrostat model ADVANTEC AGX manufactured by Toyo Engineering Works, Ltd. and it was observed that the water absorption was 0.1% or below.

Example 1

To 9.5 g of 4-chlorophenol was added 0.5 g of the powdery aromatic liquid-crystalline polyester obtained in Synthesis Example 1. The mixture was heated to 120° C. and it was observed that a clear solution was obtained with complete dissolution. The solution was cast on a glass plate and the solvent was evaporated in a ventilated oven at 70° C. for 1 hour. Thus, a clear film having a thickness of 30 μm could be obtained. As the result of a measurement of orientation pattern using a simplified molecular orientation analyzer (MOA-5012, manufactured by Oji Scientific Instruments), it was found that the anisotropic ratio of machine direction (direction of molecular flow) MD and transverse direction TD was 1, indicating that the film had no anisotropy.

Example 2

To a mixed solvent of 6 g/4 g 4-chlorophenol/1,1,2,2-tetrachloroethane was added 0.1 g of the powdery aromatic liquid-crystalline polyester obtained in Synthesis Example 1. The mixture was heated to 100° C. and it was observed that a clear solution was obtained with complete dissolution. The solution was cast on a glass plate and the solvent was evaporated in a ventilated oven at 70° C. for 1 hour. Thus, a clear and flexible film having a thickness of 30 μm could be obtained. As the result of a measurement of orientation pattern using a simplified molecular orientation analyzer (MOA-5012, manufactured by Oji Scientific Instruments), it was found that the anisotropic ratio of machine direction (direction of molecular flow) MD and transverse direction TD was 1, indicating that the film had no anisotropy.

Example 3

To 9 g of 4-chlorophenol was added 1 g of the powdery aromatic liquid-crystalline polyester obtained in Synthesis Example 1. The mixture was heated to 120° C. and, as the result, it was observed that a clear solution was obtained with complete dissolution. To this solution, 1 g of silica filler (1-FX, commercialized by Tatsumori), and the solution was stirred and defoamed to give an insulating resin solution composition.

The insulating resin solution composition was cast on a glass plate. The solvent was evaporated in a ventilated oven at 100° C. for 1 hour and then heat-treated at 190° C. for 1 hour. As the result, a film having a thickness of 30 μm could be obtained. Orientation pattern was measured using a simplified molecular orientation analyzer (MOA-5012, manufactured by Oji Scientific Instruments) and the ratio of machine direction (direction of molecular flow) MD and transverse direction TD was calculated. The result is shown in Table 1.

In addition, the linear expansion coefficient was measured for the obtained film using TMA 120 manufactured by Seiko Instrument Inc. The result is shown in Table 1.

As shown in FIG. 1(a), first a glass-epoxy substrate 1 having copper circuit patterns previously subjected to black-ening treatment at both sides was prepared. As shown in FIG. 1(b), the above-described insulating resin composition was applied with a bar coater on the substrate to a thickness of about 30 μm, and subjected to heat-treatment with a drying oven at 100° C. for 1 hour and subsequently at 190° C. for 1 hour to form a resin insulating layer 3.

As shown in FIG. 1(c), a via-hole 5 was formed on the surface of the above resin insulating layer 3 by UV-YAG laser processing and the hole penetrated to the copper circuit pattern 2. Thereafter, as shown in FIG. 1(d), the surface treatment with plasma and then electroless plating were performed.

As shown in FIG. 1(e), electroplating was carried out using the obtained electroless-plated layer 4 as the electrode to form a copper-plated layer 6 having a thickness of 18 μm as a test sample. Additionally, as shown in FIG. 1(f), a multilayer print circuit board was obtained by etching the copper-plated layer with an etching solution.

In this embodiment, a circuit was formed only on one side of the substrate. It is possible to form circuit on both side of the substrate.

The obtained sample was subjected to the following tests. The results are shown in Table 2.

Peeling Strength:

The 90-degrees peeling test was performed on a wiring pattern having a width of 1 cm according to JIS-C6481.

Fine Wiring Pattern Forming Ability Test:

A fine wiring pattern having line/space wiring pattern of 15 μm/15 μm was formed on the resin insulating layer by the semi-additive method and the shape of the pattern was observed under an optical microscope. The evaluation was given with criteria: good, no depletion was found from the top to the bottom of the circuit pattern; edge depletion, depletion was found particularly in a part of bottom edge; bad, inferior degree of depletion.

Cold-heat Shock Test:

Presence or absence of crack was observed after performing the cold-heat shock test in 1000 cycles at −65° C. to 150° C.

Insulation Reliability Test:

The insulation resistance was measured under conditions of 121° C., 85° C. and 20V using a opposite electrodes pattern having a diameter of 1 cmφ for 100 hours and a sample that maintained a resistance of 106 Ω or more was judged as acceptance.

Reflow Reliability Test:

After subjecting to pre-treatment for hygroscopic storage under the condition of JEDEC LEVEL 1, substrates having various conductor patterns were subjected 5 times to solder reflow test at a temperature of 260° C. and any deterioration such as delamination was observed. Evaluation was performed with criteria: OK, no delamination was observed in all the test; small pattern delamination, delamination of pattern was found after fourth or fifth test; large delamination, delamination was found after first to third test.

Example 4

To 95 g of 4-chlorophenol was dissolved 5 g of the powdery aromatic liquid-crystalline polyester obtained in Synthesis Example 1 at 120° C. with stirring, and the viscosity of the obtained solution was measured with TV-20 viscometer (1.5 poise, 40° C.). Then, 40 g of barium titanate (BT-HP8YF, manufactured by Kyoritsu material, average particle diameter: 7 μm) was added to the aromatic liquid-crystalline polyester solution, and the mixture was kneaded and dispersed to give a dielectric material paste. The viscosity of the dielectric material paste was measured with the TV-20 viscometer and the result showed 2.5 poise (27° C.). The dielectric material paste was applied on a glass substrate with a bar coater to a thickness of 540 μm, and the obtained layer was dried in a hot air oven at 80° C. for 1 hour, 120° C. for 1 hour, 160° C. for 1 hour and 180° C. for 1 hour. As the result, the obtained dielectric material membrane had a flat surface and a uniform membrane thickness of 45 μm.

The relative dielectric coefficient and dielectric loss of the obtained dielectric material membrane was measured with an impedance material analyzer manufactured by HP. The result showed a relative dielectric coefficient of 46 at 1 GHz and a dielectric loss of 0.03.

Comparative Example 1

To a mixed solvent of 6 g/4 g phenol/1,1,2,2-tetrachloroethtane was added 0.5 g of the powdery aromatic liquid-crystalline polyester obtained in Synthesis Example 1. The mixture was heated to 100° C. but no powdery aromatic liquid-crystalline polyester dissolved.

Comparative Example 2

To 9.5 g of 2-chlorophenol was added 0.5 g of the powdery aromatic liquid-crystalline polyester obtained in Synthesis Example 1. The mixture was heated to 120° C. but no powdery aromatic liquid-crystalline polyester dissolved.

Comparative Example 3

To 9 g of 4-chlorophenol was added 1 g of the powdery aromatic liquid-crystalline polyester obtained in Synthesis Example 1. The mixture was heated to 120° C. and it was observed that a clear solution was obtained with complete dissolution. Using this solution, the measurement of molecular orientation and that of linear expansion coefficient were performed in manners similar to that in Example 1. Also, a print circuit board was prepared and evaluated in manners similar to that in Example 3. The results are shown in Table 1.

Comparative Example 4

The measurement of molecular orientation and that of linear expansion coefficient were performed on a T die molding film (thickness: 25 μm) manufactured according to the process described in Example 1 of JP-A-Hei9-286907. Also, a print circuit board was prepared and evaluated in manners similar to that in Example 3 for a glass epoxy substrate 1 heat-pressed with the film at 320° C. 50 kg/cm² for 10 minutes.

TABLE 1

|  | Example 1 | Comparative example 1 | Comparative example 2 |
| --- | --- | --- | --- |
| Molecular orientation (TD/MD) | 1.0 | 1.0 | 1.43 |
| Linear expansion coefficient (50 to 100° C.) | | | |
| MD Direction | 44 ppm/° C. | 118 ppm/° C. | −20 ppm/° C. |
| TD direction | 44 ppm/° C. | 118 ppm/° C. | 30 ppm/° C. |
| Peeling strength | 0.8 kg/cm | 0.6 kg/cm | 0.2 kg/cm |
| Fine wiring pattern ability | Good | Good | Depletion at edge |
| Cold-heat shock test | ◯ | ◯ | ◯ |

TABLE 1-continued

|  | Example 1 | Comparative example 1 | Comparative example 2 |
| --- | --- | --- | --- |
| Insulation reliability test | Acceptance | Acceptance | Acceptance |
| Reflow reliability | OK | OK | Small pattern delamination |

The invention provides an aromatic liquid-crystalline polyester solution composition using a solvent that is easy to handle.

The aromatic liquid-crystalline polyester film obtained from the aromatic liquid-crystalline polyester solution composition of the invention is less anisotropic and excellent in low thermal expansion property and therefore the invention enabled to provide an insulating resin composition that can be applied to the production of a multilayer print circuit board.

In addition, a dielectric material membrane can be produced from the aromatic liquid-crystalline polyester solution composition containing dielectric powder according to the invention. The obtained dielectric material membrane has a flat surface, a uniform membrane thickness, a high relative dielectric coefficient and a low dielectric loss.

What is claimed is:

1. An aromatic liquid-crystalline polyester solution composition comprising 100 parts by weight of a solvent (A) and 2 to 10 parts by weight of an aromatic liquid-crystalline polyester (B), wherein said solvent (A) is a solvent containing 30% by weight or more of a chlorine-substituted phenol compound represented by the following general formula (I):

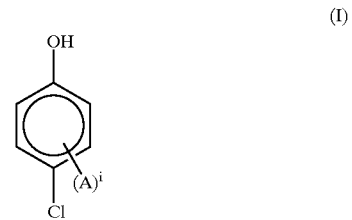

wherein A represents a hydrogen atom, a halogen atom or a tri-halogenated methyl group, and i represents an integer of 1 or more and 4 or less, and wherein the aromatic liquid-crystalline polyester comprises 30 to 80% by mole of a structural unit derived from p-hydroxybenzoic acid, 10 to 35% by mole of a structural unit derived from at least one compound selected from the group consisting of hydroquinone, resorcinol, 4,4'-dihydroxybiphenyl, bisphenol A and bisphenol S, and 10 to 35% by mole of a structural unit derived from at least one compound selected from the group consisting of terephthalic acid, isophthalic acid and naphthalenedicarboxylic acid.

2. The aromatic liquid-crystalline polyester solution composition according to claim 1, wherein the content of a structural unit derived from isophthalic acid is 0.5 mole or more when the total molar number of structural units derived from at least one compound selected from the group consisting of terephthalic acid, isophthalic acid and naphthalenedicarboxylic acid is taken as 1.

3. A process for producing an aromatic liquid-crystalline polyester film which comprises the steps of casting an aromatic liquid-crystalline polyester solution composition according to claim 1, and removing said solvent (A).

4. The aromatic liquid-crystalline polyester solution composition according to claim 1, which further comprises 1 to 100 parts by weight of an inorganic filler (C) in addition to the solvent (A) and the aromatic liquid-crystalline polyester (B).

5. The aromatic liquid-crystalline polyester solution composition according to claim 4, wherein the inorganic filler (C) is a silica having an average particle diameter of 0.1 μm or more and 10 μm or less.

6. The aromatic liquid-crystalline polyester solution composition according to claim 1, which further comprises 0.2 to 200 parts by weight of a dielectric powder in addition to the solvent (A) and the aromatic liquid-crystalline polyester (B).

7. The aromatic liquid-crystalline polyester solution composition according to claim 6, wherein the dielectric powder is at least one dielectric powder selected from the group consisting of barium titanate, strontium titanate, a solid solution of barium titanate and strontium titanate, and tantalum oxide.

8. The aromatic liquid-crystalline polyester solution composition according to claim 6, wherein the dielectric powder is added in an amount of 0.2 to 200 parts by weight per 100 parts by weight of the aromatic liquid-crystalline polyester solution composition.

* * * * *